(12) United States Patent
Rostan et al.

(10) Patent No.: US 10,693,022 B2
(45) Date of Patent: Jun. 23, 2020

(54) SOLAR CELL WITH SPECIFIC FRONT SURFACE ELECTRODE DESIGN

(71) Applicant: REC SOLAR PTE. LTD., Singapore (SG)

(72) Inventors: Philipp Johannes Rostan, Stuttgart (DE); Robert Wade, Korntal (DE)

(73) Assignee: REC SOLAR PTE. LTD., Singapore (SG)

( * ) Notice: Subject to any disclaimer, the term of this patent is extended or adjusted under 35 U.S.C. 154(b) by 168 days.

(21) Appl. No.: 15/514,745

(22) PCT Filed: Sep. 28, 2015

(86) PCT No.: PCT/IB2015/001718
§ 371 (c)(1),
(2) Date: Mar. 27, 2017

(87) PCT Pub. No.: WO2016/051251
PCT Pub. Date: Apr. 7, 2016

(65) Prior Publication Data
US 2017/0243992 A1    Aug. 24, 2017

(30) Foreign Application Priority Data
Sep. 29, 2014    (GB) .................................. 1417240.7

(51) Int. Cl.
*H01L 31/0224*    (2006.01)
*H01L 31/02*    (2006.01)
*H01L 31/05*    (2014.01)

(52) U.S. Cl.
CPC .. *H01L 31/022433* (2013.01); *H01L 31/0201* (2013.01); *H01L 31/0504* (2013.01); *Y02E 10/50* (2013.01)

(58) Field of Classification Search
CPC ......... H01L 31/022433; H01L 31/0201; H01L 31/0504
(Continued)

(56) References Cited

U.S. PATENT DOCUMENTS

| 4,430,519 A | * | 2/1984 | Young | ................... H01L 31/188 136/244 |
| 2010/0218799 A1 | * | 9/2010 | Stefani | ................ H01L 31/0201 136/244 |

(Continued)

FOREIGN PATENT DOCUMENTS

| CN | 202678324 U | 1/2013 |
| CN | 102024884 B | 3/2013 |

(Continued)

OTHER PUBLICATIONS

International Search Report and Written Opinion dated Dec. 18, 2015, PCT Patent Application No. PCT/IB2015/001718, filed Sep. 28, 2015, European Patent Office.

*Primary Examiner* — Jayne L Mershon
(74) *Attorney, Agent, or Firm* — Mannava & Kang, P.C.

(57) ABSTRACT

A solar cell (104) is disclosed. The solar cell includes a substrate (151) including a front surface (156) and front surface electrodes (153) extending along the front surface (156). Therein, the front surface electrodes comprise a plurality of bus bar electrodes (152) coupled to a plurality of first finger electrodes (153₁) arranged in a parallel finger region (105) and second finger electrodes (153₂) arranged in a palm finger region (106). The first finger electrodes (153₁) are substantially parallel to each other and perpendicular to the bus bar electrodes (152). The second finger electrodes (153₂) originate from end regions of the bus bar electrodes (152) and radially extend at least in portions thereof in directions non-perpendicular to the bus bar electrodes (152). Therein, a palm-like group of neighboring second finger (Continued)

electrodes ($153_2$) originates from a same associated bus bar electrode (152) and neighboring second finger electrodes ($153_2$) radially extend at different angles with respect to the bus bar electrodes (152). With such electrode configuration, shading losses as well as electrical resistance losses may be reduced.

15 Claims, 5 Drawing Sheets

(58) Field of Classification Search
USPC .......................................................... 136/256
See application file for complete search history.

(56) References Cited

U.S. PATENT DOCUMENTS

2012/0138141 A1\* 6/2012 Kim ................ H01L 31/022433
136/256
2012/0211050 A1\* 8/2012 Nishimoto ...... H01L 31/022433
136/244

FOREIGN PATENT DOCUMENTS

| CN | 103325876 A | 9/2013 |
|----|---|---|
| CN | 103943695 | 7/2014 |
| EP | 1770791 | 4/2007 |
| EP | 2261994 | 12/2010 |
| GB | 2459651 | 11/2009 |
| JP | 2003258277 A | 9/2003 |
| KR | 20140052112 | 5/2014 |
| WO | 2012/001815 A1 | 1/2012 |
| WO | WO-2014031137 | 2/2014 |

\* cited by examiner

SOLAR CELL WITH SPECIFIC FRONT SURFACE ELECTRODE DESIGN

CLAIM FOR PRIORITY

The present application is a national stage filing under 35 U.S.C. § 371 of PCT application number PCT/IB2015/001718, having an international filing date of Sep. 28, 2015, which claims priority to GB Patent Application Number 1417240.7, having a filing date of Sep. 29, 2014, the disclosures of which are hereby incorporated by reference in their entireties.

FIELD OF THE INVENTION

The present invention relates to solar cells and particularly to a design of front surface electrodes of such solar cells.

TECHNICAL BACKGROUND

Solar cells are electrical devices used to convert sunlight into electricity by a photovoltaic effect. Electrodes are provided on solar cell surfaces in order to enable transporting electrical energy generated in a cell to external electrically powered components.

On a light receiving side of a photovoltaic cell, it is common practice to optimize a light receiving area while ensuring acceptable series resistance using a metallic grid with many thin parallel finger electrodes that are connected to two, three, four or more wider bus bar electrodes extending perpendicular to the finger electrodes and used for collecting an electric current from the finger electrodes. In such optimization procedure, typically finger electrode widths, finger electrode spacings, bus bar electrode widths and bus bar electrode spacings are optimized. Thereby, resistive power losses may be reduced and cell efficiency may be increased.

SUMMARY OF THE INVENTION

There may be a desire to achieve further reduced resistive power loss and higher cell efficiency in solar cells.

Such desire may be fulfilled with a solar cell according to the independent claim.

Advantageous embodiments are defined in the dependent claims.

According to an aspect of the invention, a solar cell is proposed comprising a substrate including a front surface and front surface electrodes extending along the front surface. Therein, the front surface electrodes comprise a plurality of bus bar electrodes coupled to a plurality of first finger electrodes arranged in a parallel finger region and second finger electrodes arranged in a palm finger region. The first finger electrodes are substantially parallel to each other and perpendicular to the bus bar electrodes. The second finger electrodes originate from end regions of the bus bar electrodes and radially extend at least in portions thereof in directions non-perpendicular to the bus bar electrodes. Therein, a palm-like group of neighboring second finger electrodes originates from a same associated bus bar electrode and neighboring second finger electrodes radially extend at different angles with respect to the bus bar electrodes.

Principles relating to embodiments of the present invention may be understood as being based, inter alia and without restricting a scope of the invention, on the following ideas and recognitions:

In conventional electrode designs, bus bar electrodes may cover significant portions of a solar cell front surface and resulting shading may significantly contribute to losses in cell efficiency.

It has been found that, while in some portions of the solar cell low series resistances achievable by relatively thick bus bar electrodes may be crucial or at least beneficial, there may be regions on a solar cell surface at which no thick bus bar is required for charge carrier collection from electrode fingers. Particular, in a second region close to an edge of the solar cell at which the front surface electrode grid is not electrically connected to a rear surface electrode grid of an adjacent solar cell, only low electrical currents have to be conducted in a direction perpendicular to the electrode fingers whereas in a first region close to an opposite edge of the solar cell at which the front surface electrode grid is electrically connected to the rear surface electrode grid of another adjacent solar cell, high electrical currents have to be conducted in a direction perpendicular to the electrode fingers. Thus, it has been found that, while in the second region one or more bus bar electrode may be indispensable, in the first region generated charge carrier densities may be collected without wide or thick bus bar electrodes.

It is therefore proposed to provide a front surface electrode design with the first region being referred to as "parallel finger region" and with the second region being referred to as "palm finger region". In the parallel finger region, first finger electrodes are connected to one or more bus bars. Generally, the first finger electrodes are straight and cross the bus bar electrodes perpendicularly. In the palm finger region, no bus bars are required. Instead, second finger electrodes are provided in a direction non-perpendicular to the bus bars. These second finger electrodes may extend from an end region of one of the bus bars, i.e. from a border of the parallel finger region, deep into the palm finger region thereby enabling charge carrier collection from this palm finger region towards the associated bus bar. A plurality of such second electrodes may be grouped to one "palm group" of second electrodes merging into one same bus bar electrode and having an appearance of a palm tree. Each of the parallel finger region and the palm finger region typically has a rectangular shape. Together, the parallel finger region and the palm finger region cover almost the entire front surface of the solar cell substrate, i.e. for example at least 90% thereof. Generally, the parallel finger region directly abuts the palm finger region. The number of bus bar electrodes in the parallel finger region generally corresponds to the number of palm groups in the palm finger region.

Shading losses of such electrode design may be significantly lower than in conventional electrode designs while enabling similarly small electrical resistive losses.

According to an embodiment, a width of the palm-finger region is between 10% and 100%, preferably between 25% and 75%, of a distance between two neighboring bus bar electrodes. Herein, the width of the palm-finger region shall be measured in a direction perpendicular to the longitudinal direction of the elongate bus bars and shall refer to the width of a single palm-like group of neighboring second finger electrodes. Furthermore, a length of the palm finger region may preferably be e.g. between about 25% to about 75% of the spacing between two adjacent bus bar electrodes, the length of the palm-finger region being measured in a direction parallel to the longitudinal direction of the elongate bus bars. In other words, the palm finger region is dimensioned such as to cover a significant portion of the front surface of the substrate such that shading losses in this portion may be reduced. However, the length and/or width of the palm finger region should not be too large and should preferably not exceed the distance between neighboring bus bar electrodes such as to prevent excessive electrical resistance losses.

According to an embodiment, the second finger electrodes are configured such that spacings between neighboring second finger electrodes are below 3 mm, i.e. from 0 to 3 mm. As neighboring second finger electrodes are generally arranged at an angle with respect to each other, their lateral distance will depend on the position along their longitudinal extension but should preferably at no position exceed 3 mm in order to avoid excessive lateral electrical series resistances.

According to an embodiment, the solar cell comprises one side having half or a lower fraction of a length of an adjacent side. In other words, the solar cell is preferably not square but has an elongate rectangular shape. Accordingly, the solar cell has two parallel shorter sides and two parallel longer sides. Preferably, the shorter sides have half the length or less compared to the longer sides. Generally, each side corresponds to an edge of the substrate. Adjacent sides are typically arranged perpendicular to each other. In such shape, the palm finger region may make up a relatively larger portion of the entire cell surface and may therefore better establish its beneficial effects.

According to an embodiment, the solar cell comprises conductive ribbons, sometimes also referred to as soldering strips, soldered on the bus bar electrodes. These ribbons may increase electrical conductivity along the bus bar electrodes. Generally, a series resistance within the ribbon is lower than a series resistance within the bus bar. Preferably, the conductive ribbons do not extend into the palm finger region. Thereby, shading may be minimized while providing for sufficient electrical conductivity. Furthermore, material costs for the ribbons may be reduced.

According to an embodiment, the bus bar electrodes have length of less than 90%, preferably less than 70%, of a length of the substrate in a direction parallel to the bus bar electrodes. In other words, the bus bar electrodes do preferably not extend along the entire length of the solar cell substrate but may extend e.g. only in the parallel finger region.

According to an embodiment, second finger electrodes divide into several branches upon extending radially away from an associated bus bar electrode. For example, close to an associated bus bar, a number of e.g. between 2 and 20 second finger electrodes may emerge from an end region of the bus bar electrode. Farer away from such position, some or each of these second finger electrodes may divide into two or more branches. Thereby, lateral distances between neighboring finger electrodes or branches thereof may be minimized thereby keeping electrical resistances small.

According to an embodiment, end regions opposite to an associated bus bar electrode of second electrode fingers of a palm-like group of neighboring second finger electrodes are interconnected to end regions of second electrode fingers of a neighboring palm-like group of neighboring second finger electrodes via third finger electrodes extending substantially parallel to each other and perpendicular to the bus bar electrodes. In other words, the second finger electrodes may not only be electrically connected to their associated bus bar electrode at one end thereof but furthermore the other end thereof may be electrically connected, via third finger electrodes, to second finger electrodes emerging from a neighboring bus bar. This may reduce overall electrical resistances.

According to an embodiment, the second finger electrodes have a width smaller than a width of the bus bar electrodes. For example, the bus bars may typically be between 0.5 and 3 mm wide whereas finger electrodes may be between 10 and 200 μm wide.

According to an embodiment, at least one of the second finger electrodes extends up to a position less than 3 mm, preferably less than 1.5 mm, away from an edge of the substrate. In other words there should be second finger electrodes extending from an associated bus bar electrode across essentially the entire palm finger region up to an opposite edge of the substrate. Thus, charge carriers may be collected throughout the entire palm finger region.

According to an embodiment, the substrate has a surface area of at least 25 cm$^2$, preferably at least 50 cm$^2$. For example, the substrate may have dimensions of 100×50 mm$^2$, 125×62.5 mm$^2$ or 156×78 mm$^2$. In other words, the solar cells may be designed for a flat panels, i.e. for large area solar modules, but not for concentrator applications.

Objects, along with possible advantages and features of the presentation herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, the same reference characters generally refer to same or similar parts throughout the different views. Also, the drawings are only schematically and not necessarily to scale, emphasis instead generally being placed upon illustrating the principles of the invention. In the following description, various embodiments are described with reference to the following drawings, in which.

DESCRIPTION OF PREFERRED EMBODIMENTS

Embodiments generally relate to devices, for example, devices for converting energy of light into electrical energy. More particularly, the devices may be solar cell elements or solar cell modules including a plurality of solar cell elements.

Figure 1:
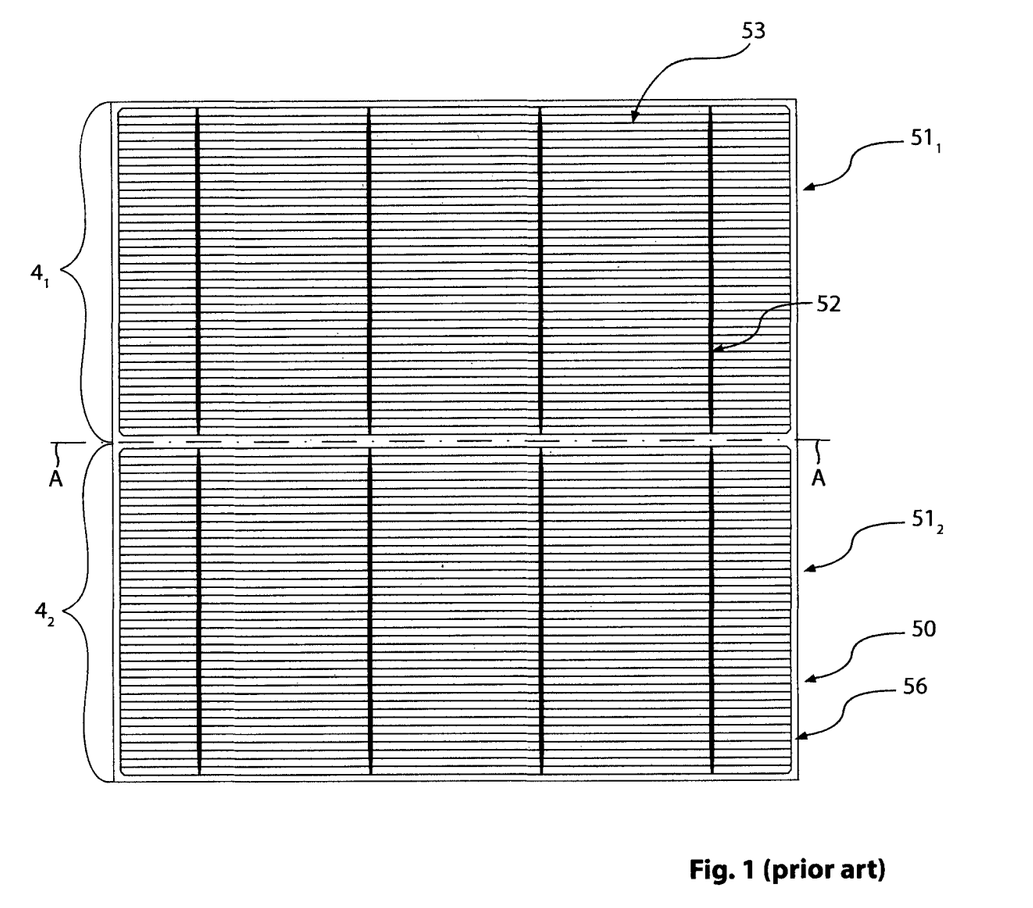
FIG. 1 shows a front surface of a substrate to be cut in two pieces with a conventional electrode design.

FIG. 1 shows a pair of half-cut solar cells $4_1$ and $4_2$. They may be obtained by cutting a normal full-size substrate 50 for a solar cell with 15.6×15.6 cm$^2$ dimensions into two equal portions along a direction substantially perpendicular to bus bars 52, as indicated by a dashed line A-A, thereby forming elongate rectangular solar cell substrates $51_1$ and $51_2$. Other sizes of the substrate 50, for example, about 12.5×12.5 cm² or about 10×10 cm², may also be useful. A conventional electrode design with parallel fingers 53 running perpendicular to bus bars 52 is provided on a front surface 56 of the substrate 50.

Figure 2A:
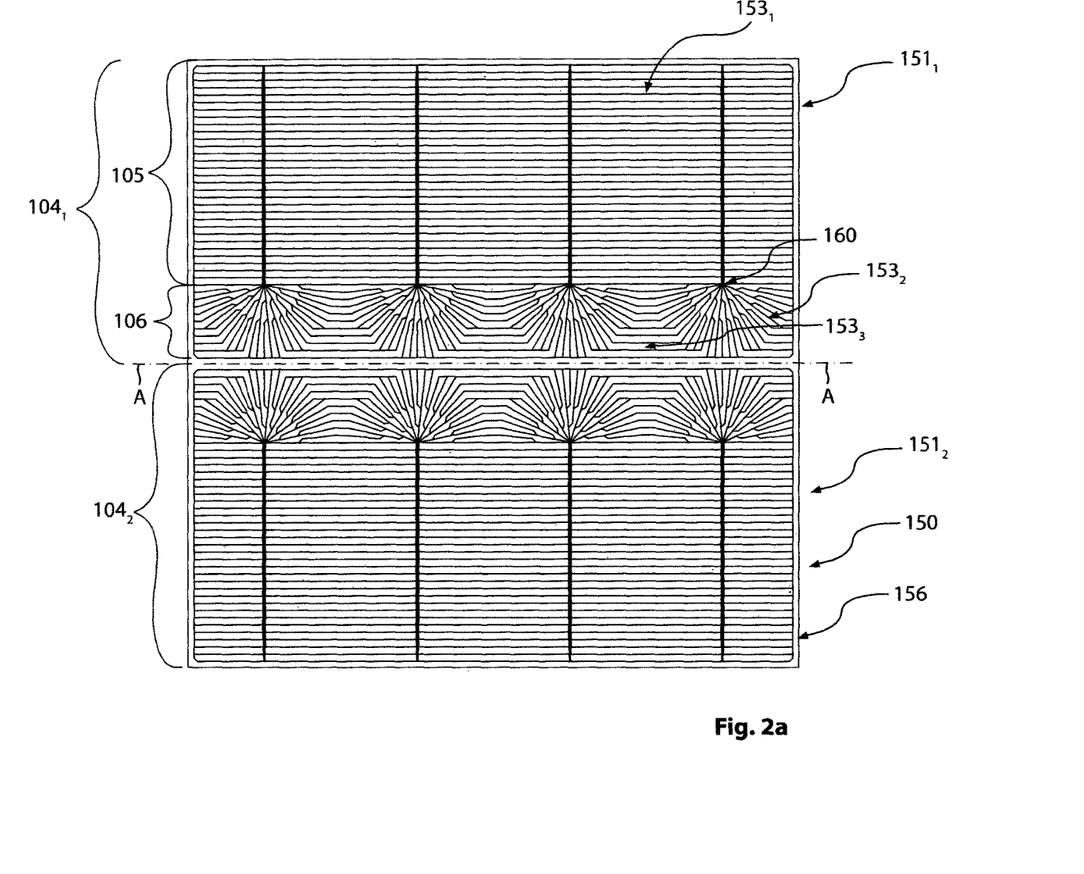
FIGS. 2a, b show a front surface of a substrate with a specific electrode design for forming solar cells according to an embodiment of the invention before and after cutting in two pieces and rearranging, respectively.

FIG. 2a shows an embodiment of a pair of half-cut solar cells $104_1$ and $104_2$ on substrates $151_1$ and $151_2$ with an electrode configuration with linear first finger electrodes $153_1$ in a parallel finger electrode region 105 and with a palm-finger electrode configuration in a palm finger region 106. The two solar cells $104_1$ and $104_2$ may be provided by generating two electrode configurations on a common square substrate 150 and then cutting the substrate 150 into half substrates $151_1$ and $151_2$ along the line A-A.

It is also advantageous to implement the palm-finger electrode design on normal full size cells with square substrates, but the benefit is lower than for cut cells with elongate rectangular substrates due to that the palm-finger region covers a proportionally lower part of the cell area. Solar cells may be cut by laser. Other cutting methods may also be possible. By cutting the solar cells into half, resistive power losses which show a parabolic dependence on the length of the cells, may effectively be reduced. Power output may be improved by about 2%, i.e. cutting cells in elongate rectangular halves may give approximately 2% relative increase in module power over full size square cells with the same cell technology. A design where the solar cells are cut along 3 parallel equidistant lines into 4 parts each with a palm-finger electrode design will have further reduced series resistance.

Figure 2B:
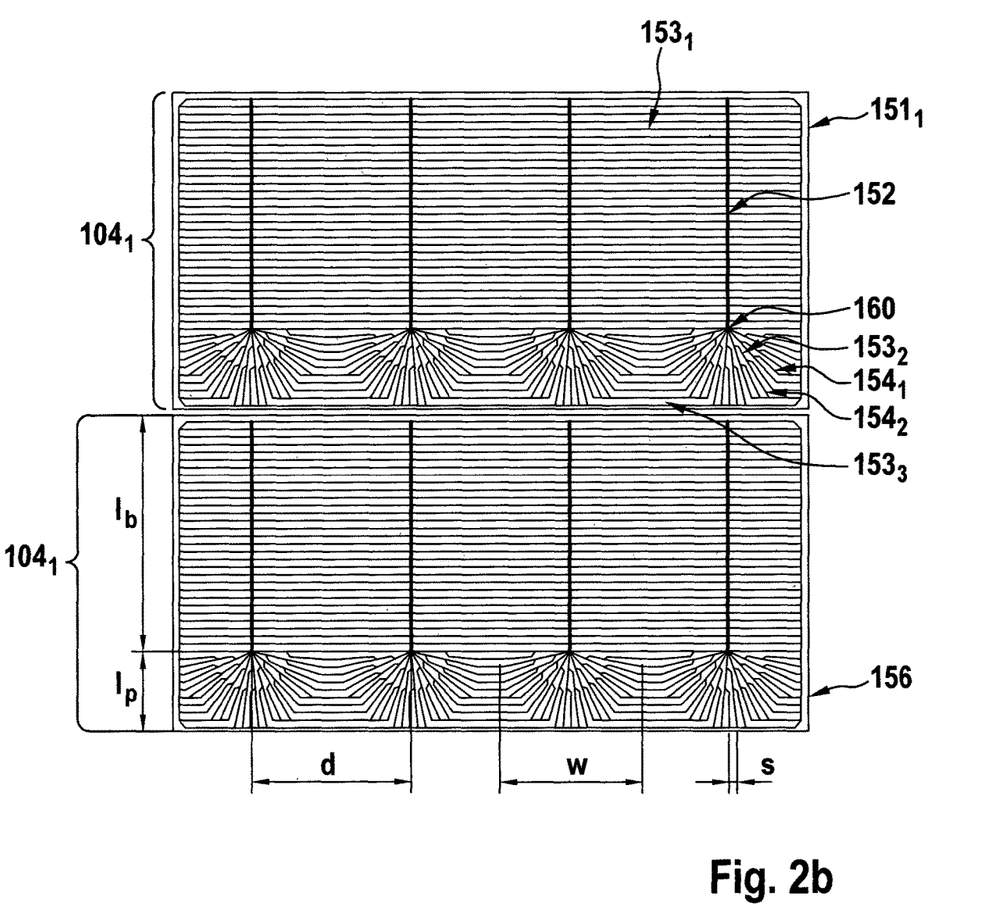

In one embodiment, as shown in FIG. 2a, a front surface 156 of a substrate 150 for each of half-cut solar cells $104_1$ or $104_2$ includes a plurality of front surface electrodes. FIG. 2b shows how the half cut solar cells will be oriented in a solar cell assembly after cutting.

The front surface electrodes may include many thin parallel finger electrodes 153 connected to a plurality of wider bus bar electrodes 152 extending perpendicular to the finger electrodes 153 and used for collecting the electric current from the finger electrodes 153.

Figure 3:
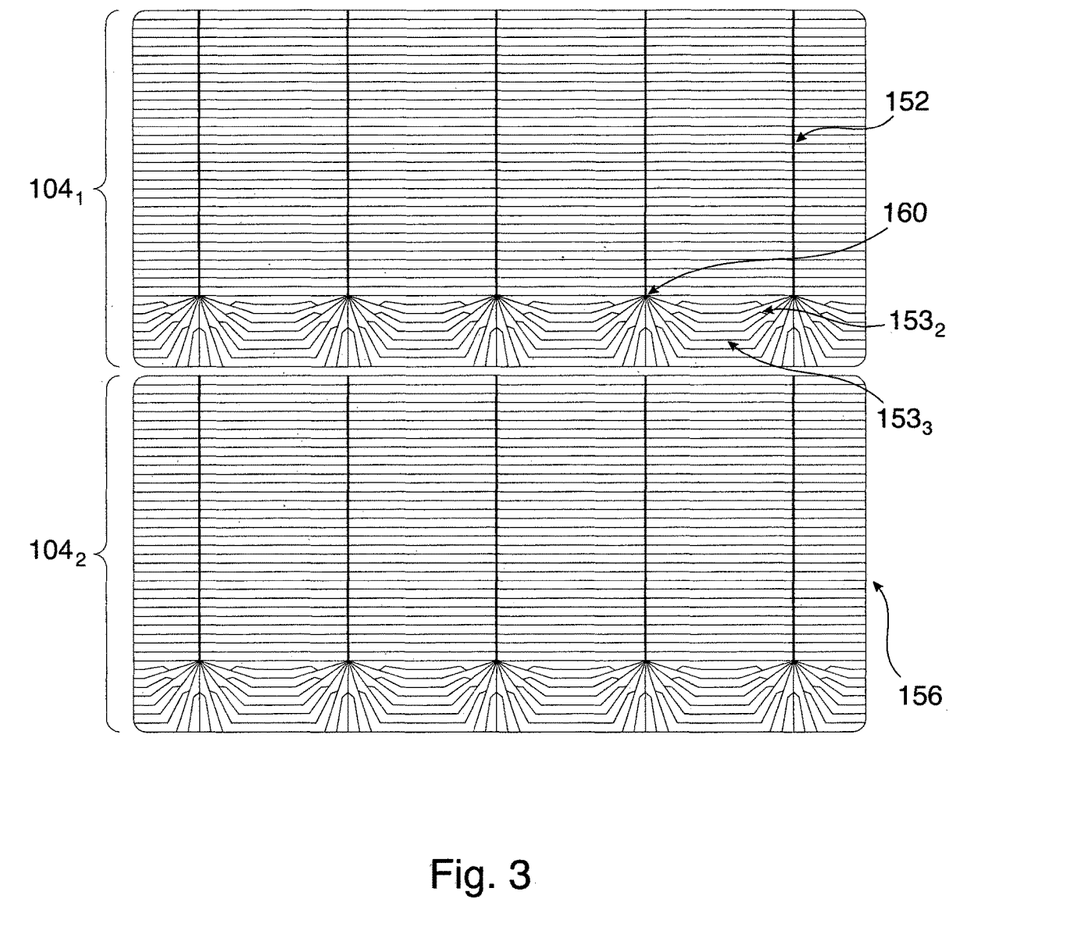
FIG. 3 shows a front surface of a substrate with another specific electrode design for forming solar cells according to an alternative embodiment of the invention after cutting in two pieces and rearranging, respectively.

For example, the front surface electrodes may include four front surface bus bar electrodes 152 and a large number of front surface finger electrodes 153 as shown in FIGS. 2a and b or five front surface bus bar electrodes 152 as shown in FIG. 3. Having other numbers of front surface bus bar electrodes, for example 2 or 3 or 6 or more, may also be useful.

The front surface finger electrodes 153 may be electrodes configured to collect photo-induced carriers. In one embodiment, a plurality of the front surface finger electrodes 153 are arranged substantially parallel to each other and parallel to one long edge of the elongate substrate $151_1$ and almost throughout the front surface of the substrate in the parallel finger regions 105, i.e. in the regions without palm-finger electrodes. The width of a front surface finger electrode 153 may be between about 30 µm and about 100 µm, for example about 60 µm. The front surface finger electrodes 153 may or may not all have the same width. The front surface finger electrodes 153 may have a constant width or alternatively the width may vary along the length of a front surface finger electrode and a front surface finger electrode may for example be tapered towards its ends from about 60 µm or above to about 30 µm or below. The front surface finger electrodes in the region without palm-finger electrodes may be equally spaced apart. The spacing between two adjacent front surface finger electrodes may be between about 1 mm and about 3 mm, for example about 2 mm. Front surface finger electrodes with uneven spacing may also be useful.

In one embodiment, the portion from one end to a fraction of length of a bus bar electrode 152 in FIG. 1 is replaced by the second finger electrode $153_2$ in the palm finger region 106. The length of the bus bar electrode to be replaced by the second finger electrode $153_2$, i.e. the length $l_p$ of the palm finger region (as shown in FIG. 2b), may be e.g. between about 25% to about 75% of the distance d or spacing between two adjacent bus bar electrodes 152. A width w of a single palm-like group of neighboring second finger electrodes $153_2$ of the palm finger region may be e.g. between 10% and 100%, preferably between about 25% to about 75%, of the distance d between two adjacent bus bar electrodes 152.

In one embodiment, the second finger electrodes $153_2$ originate from the ends 160 of the bus bar electrodes 152 and extend to merge with third finger electrodes $153_3$. In between, some or each of the second finger electrodes $153_2$ may split into branches $154_1$, $154_2$. The second finger electrodes $153_2$ may be configured in such a way that the spacings between the adjacent second finger electrodes $153_2$ fall within the range from about 0 to about 3 mm. The finger electrode spacings should be optimized such that the power losses of the emitter and shading losses are kept minimal. The configuration also allows the use of less silver paste per solar cell substrate. One exemplary embodiment of such configurations is shown in FIG. 2a with the second finger electrodes $153_2$ radiating from the ends of the bus bar electrodes 160.

The number of bus bar electrodes may be 4 or 5, as shown in FIG. 2a,b and FIG. 3. Other numbers of bus bar electrodes, for example, 2, 3 or 6 or more, may also be useful.

The front surface bus bar electrodes 152 are be substantially parallel to each other and substantially perpendicular to the front surface finger electrodes 153 in the regions without palm-finger electrodes. The width of a front surface bus bar electrode may be between about 0.5 mm and about 2.5 mm, for example about 1.5 mm. The front surface bus bar electrodes may have a continuous width or alternatively the width may vary along the length of a front surface bus bar electrode and a front surface bus bar electrode may for example be tapered towards its ends. The front surface bus bar electrodes may or may not have all the same width. The front surface bus bar electrodes may be equally spaced apart. The spacing between two adjacent front surface bus bar electrodes may be dependent on the cell size and number of bus bar electrodes. For example, the spacing between two adjacent front surface bus bar electrodes may be about 39 mm for a 15.6×15.6 cm² photovoltaic cell element with four front surface bus bar electrodes 152. Front surface bus bar electrodes 152 with uneven spacing may also be useful. The front surface bus bar electrodes 152 and the finger electrodes 153 may be made of the same or different materials and may be made preferably with a solderable material, and may have the same or a different thickness compared to the finger electrodes.

The front surface finger electrodes may be made of a paste including copper, silver, an alloy where one of these metals are the major component or any other conducting material. For example, the front surface finger electrodes 153 as well as the front surface bus bar electrodes 152 may be made using various methods such as industrially applicable production methods as e.g. screen printing, roller printing, ink jet printing, etc.

A plurality of the half-cut cells may be assembled in solar cell units. Every two half-cut cells may be arranged in such a way that the palm-finger structures of one half-cut cell may be adjacent to the bus bar electrodes 152 of the adjacent half-cut cell as shown in FIG. 2b and FIG. 3.

Figure 4:
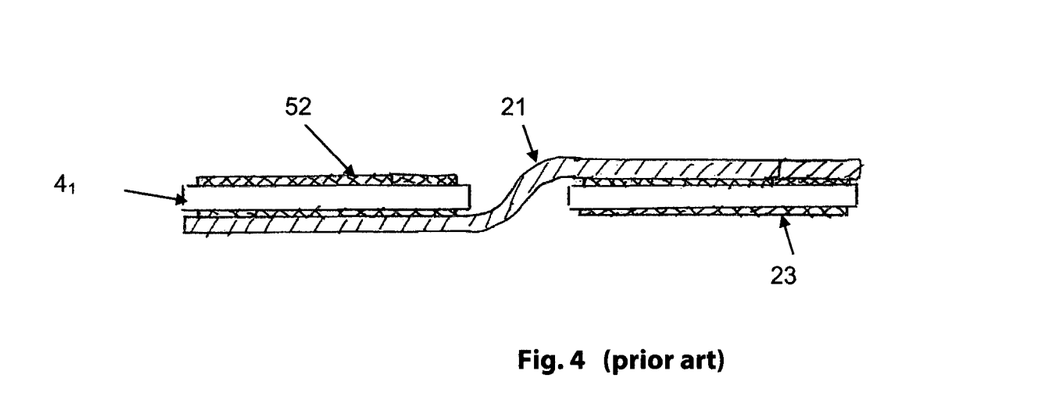
FIG. 4 shows a side view of an assembly with a metal ribbon connecting conventional neighboring conventional solar cells.
Figure 5:
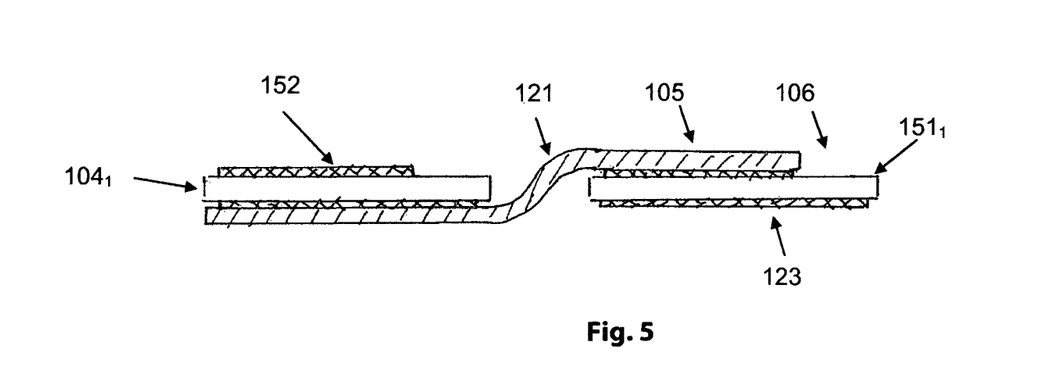
FIG. 5 shows a side view of an assembly with a metal ribbon connecting neighboring solar cells according to an embodiment of the invention.

FIGS. 4 and 5 show side views of a part of a string of solar cells 4₁, 104₁ connected with metal ribbons 21, 121, which are attached to rear side bus bars 23, 123 and front side bus bars 52, 152, respectively.

This and similar configurations may result in less paste consumption and higher cell efficiency due to less shading losses. Further, the reduction of the front surface bus bar electrodes 152 by replacing portions of them with second finger electrodes 153₂ may reduce stress on the cell substrate 151₁. In addition, as conducting metallic ribbons 121 may be soldered to the front surface bus bar electrodes 152 in module assembly, the ribbons 121 at least may not need to be soldered in the area occupied by the second finger electrodes 153₂ as shown in FIG. 5. Therefore, the reduced front surface bus bar electrodes 152 may also result in reduction in ribbon consumption compared to the standard connection with ribbons as shown in FIG. 4.

The invention may be embodied in other specific forms without departing from the scope of the invention. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

Terms such as "about" in conjunction with a specific distance or size are to be interpreted as not to exclude insignificant deviation from the specified distance or size and may include for example deviations of up to 20%. Furthermore, terms such as "substantially parallel" or "substantially perpendicular" are to be interpreted as not to exclude insignificant deviation from the specified arrangement and may include for example deviations of up to 10° or even up to 20°. Particularly, one skilled in the art will understand that insignificant deviations from a strictly parallel arrangement may be acceptable as long as they do not induce e.g. excessive serial resistance losses which is assumed to be the case as long such deviations do not exceed 10° or 20°.

Finally, it should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

The invention claimed is:

1. A solar cell comprising:
a substrate including a front surface; and
front surface electrodes extending along the front surface, wherein the front surface electrodes comprise:
a plurality of elongate bus bar electrodes coupled to a plurality of first elongate finger electrodes arranged in a parallel finger region and second elongate finger electrodes arranged in a palm-finger region,
the first finger electrodes being substantially parallel to each other and perpendicular to the bus bar electrodes,
the second finger electrodes originating from end regions of the bus bar electrodes and radially extending at least in portions thereof in directions non-perpendicular to the bus bar electrodes, wherein the second finger electrodes divide into several branches upon extending radially away from an associated bus bar electrode, and
wherein a group of neighboring second finger electrodes and branches thereof originates from a same associated bus bar electrode and each electrode and branch of the group of neighboring second finger electrodes and branches thereof radially extends at a different angle with respect to the bus bar electrodes compared to each other electrode and branch of the group of neighboring second finger electrodes and branches thereof.

2. The solar cell of claim 1, wherein a width (w) of a single group of neighboring second finger electrodes of the palm-finger region is between 10% and 100% of a distance (d) between two neighboring bus bar electrodes, the width (w) being measured in a direction perpendicular to a longitudinal direction of the bus bar electrodes.

3. The solar cell of claim 1, wherein a width (w) of a single group of neighboring second finger electrodes of the palm-finger region is between 25% and 75% of a distance (d) between two neighboring bus bar electrodes, the width (w) being measured in a direction perpendicular to a longitudinal direction of the bus bar electrodes.

4. The solar cell of claim 1, wherein the second finger electrodes are configured such that spacings (s) between neighboring second finger electrodes are from 0 to 3 mm.

5. The solar cell of claim 1, comprising one side having half or a lower fraction of a length of an adjacent side.

6. The solar cell of claim 1, comprising conductive ribbons soldered on the bus bar electrodes.

7. The solar cell of claim 6, wherein the conductive ribbons do not extend into the palm-finger region.

8. The solar cell of claim 1, wherein the bus bar electrodes have lengths ($l_b$) of less than 90% of a length of the substrate in a direction parallel to the bus bar electrodes.

9. The solar cell of claim 1, wherein the bus bar electrodes have lengths ($l_b$) of less than 70% of a length of the substrate in a direction parallel to the bus bar electrodes.

10. The solar cell of claim 1, wherein the branches radially extend at least in portions thereof in directions non-perpendicular to the bus bar electrodes.

11. The solar cell of claim 1, wherein end regions opposite to an associated bus bar electrode of second electrode fingers of a group of neighboring second finger electrodes are interconnected to end regions of second electrode fingers of a neighboring group of neighboring second finger electrodes via third finger electrodes extending substantially parallel to each other and perpendicular to the bus bar electrodes.

12. The solar cell of claim 1, wherein the second finger electrodes have a width smaller than a width of the bus bar electrodes.

13. The solar cell of claim 1, wherein at least one of the second finger electrodes extends up to a position less than 3 mm away from an edge of the substrate.

14. The solar cell of claim 1, wherein the substrate has a surface area of at least 25 cm².

15. The solar cell of claim 1, wherein a length of the palm-finger region is between 25% and 75% of distance (d) between two neighboring bus bar electrodes, the lengths being measured in a direction parallel to a longitudinal direction of the bus bar electrodes.

* * * * *